United States Patent
Han et al.

(10) Patent No.: US 8,441,284 B1
(45) Date of Patent: May 14, 2013

(54) FLEXIBLE UPDATING OF MULTI-BIT REGISTERS

(75) Inventors: Wei Han, Beaverton, OR (US); Mose Wahlstrom, Aloha, OR (US); Warren Juenemann, Cornelius, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 70 days.

(21) Appl. No.: 13/154,885

(22) Filed: Jun. 7, 2011

(51) Int. Cl.
*H03K 19/173* (2006.01)
(52) U.S. Cl.
USPC .............................................. 326/38; 326/40
(58) Field of Classification Search .............. 326/37–41, 326/47
See application file for complete search history.

(56) References Cited

U.S. PATENT DOCUMENTS
2005/0268193 A1* 12/2005 Waayers ....................... 714/727

* cited by examiner

*Primary Examiner* — Jany Richardson

(57) ABSTRACT

Various techniques are provided to flexibly update data fields stored in multi-bit registers. In one example, a method of updating a control register within an integrated circuit includes storing a plurality of initial bit values in the control register within the integrated circuit. The method also includes receiving a data set comprising one or more corrective bit values and one or more non-corrective bit values. The method also includes performing a logic operation on the received data set and the initial bit values to provide updated bit values. The method also includes replacing the initial bit values with the updated bit values in the control register.

24 Claims, 3 Drawing Sheets

FLEXIBLE UPDATING OF MULTI-BIT REGISTERS

TECHNICAL FIELD

The present invention relates generally to the storage of data in registers within integrated circuits and, more particularly, to the updating of data stored in such registers.

BACKGROUND

In an integrated circuit such as a programmable logic device (PLD) (e.g., a field programmable gate array (FPGA), a complex programmable logic device (CPLD), a field programmable system on a chip (FPSC), or other type of programmable device), control registers may be used to store bit values to select various operational settings, such as manufacturing settings or trim settings.

Existing PLDs may use one or more large registers to store bit values for multiple unrelated settings. For example, a single register may store multiple data fields (e.g., sets of one or more bit values), with each data field corresponding to different unrelated manufacturing or trim settings. However, conventional implementations of registers and related circuitry are often limited in the way that stored bit values may be updated, particularly if data in only a single data field of a register is to be updated.

In one approach, to change a single data field in a conventional register, the changed data field and all remaining data fields of the register typically must be provided again to the PLD and reloaded into the register. This may require an operator to store or otherwise recall all data fields of the register externally to the PLD and subsequently provide all data fields again to the PLD, regardless of how many data fields are actually changed. Such implementations may be problematic when the operator may know the values of one or more data fields to be changed, but may not know the values of other data fields that should not be changed (e.g., data fields with bit values provided by other operators or other parties).

In another approach, multiple access methods (e.g., instructions or addresses) may be used to update specific data fields within a large register. But such an approach may require extensive circuitry which may not scale economically as the number of data fields increases.

As a result, there is a need for an improved approach to changing specific data fields in a register that overcomes one or more of the problems associated with existing approaches.

SUMMARY

In accordance with one embodiment of the present invention, a method of updating a control register within an integrated circuit includes storing a plurality of initial bit values in the control register within the integrated circuit; receiving a data set comprising one or more corrective bit values and one or more non-corrective bit values; performing a logic operation on the received data set and the initial bit values to provide updated bit values; and replacing the initial bit values with the updated bit values in the control register.

In accordance with another embodiment of the present invention, an integrated circuit includes a control register adapted to store a plurality of initial bit values for controlling operation of the integrated circuit; a logic circuit in communication with the control register; a feedback path adapted to pass the initial bit values from the control register to the logic circuit; and wherein the logic circuit is adapted to selectively perform a logic operation on a received data set and the initial bit values to provide updated bit values to the control register to replace the initial bit values.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with embodiments set forth herein, various techniques are provided to permit one or more stored bit values to be updated in a register without requiring knowledge of other bit values previously stored in the register. For example, in one embodiment, a configuration logic circuit of a PLD may receive a data set (e.g., parallel data received over a multi-bit bus or serial data received as a bitstream) over a data input path from an operator (e.g., a software or hardware tool provided as part of a machine-operated or human-operated system). The data set may include a plurality of bit values, with each data set bit value being associated with a corresponding bit location of the register.

An initial data set may include initial bit values to be stored in the register. Another data set may include corrective bit values and non-corrective bit values. The operator may set the corrective bit values to selectively update particular data fields of the register, and set the non-corrective bit values to leave other data fields of the register unchanged. In this regard, the operator may set all non-corrective bit values to default values, and may set corrective bit values to non-default values.

A logic circuit of the configuration logic circuit may be selected to perform an associated logic operation on the data set bit values and the initial bit values stored in the register to provide updated bit values for the register. In this regard, when the selected logic operation is performed on a corrective bit value and an initial bit value, the resulting updated bit value may be selectively changed in relation to the initial bit value (e.g., depending on the particular logic operation performed).

On the other hand, when the logic operation is performed on a non-corrective bit value and an initial bit value, the resulting updated bit value may correspond to the initial bit value (e.g., the resulting updated bit value may remain unchanged in relation to the initial bit value). As a result, the operator may selectively change particular data fields of the register without requiring the operator to know the values of other data fields of the register.

In one embodiment, the register may be a control register used to store various bit values for controlling operation of an integrated circuit. In other embodiments, the register may be any other type of register as may be desired for various applications.

Figure 1:
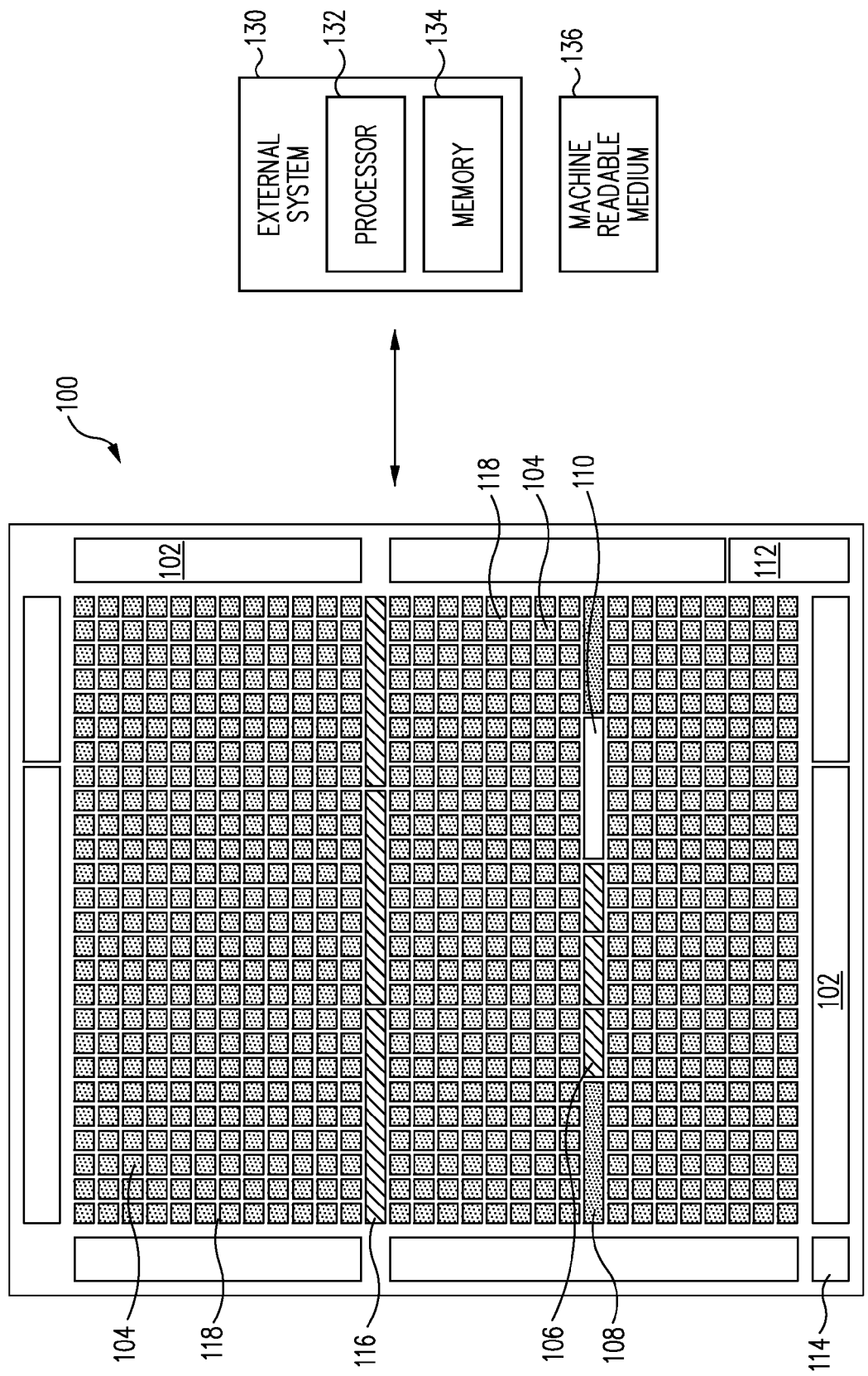
FIG. 1 illustrates a block diagram of a programmable logic device (PLD) in accordance with an embodiment of the invention.

Referring now to the figures, FIG. 1 illustrates a block diagram of a programmable logic device (PLD) 100 in accordance with an embodiment of the invention. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the invention as disclosed herein are not limited to programmable logic devices, such as PLD 100, and may be applied to various other types of programmable devices, as would be understood by one skilled in the art.

In one embodiment, an external system 130 (e.g., a hardware or software tool) may be used to provide initial bit values, corrective bit values, and non-corrective bit values to PLD 100. For example, external system 130 may provide such bit values to configuration port 112 and/or other portions of PLD 100. External system 130 may include, for example, one or more processors 132 which may be configured to execute instructions, such as software instructions, provided in one or more memories 134 and/or stored in non-transitory form in one or more non-transitory machine readable mediums 136.

The various techniques disclosed herein are applicable to a wide variety of integrated circuits and applications. As an exemplary implementation, a PLD will be utilized to illustrate the techniques in accordance with one or more embodiments of the invention. However, it should be understood that this is not limiting and that the techniques disclosed herein may be implemented as desired, in accordance with one or more embodiments of the invention, within various types of circuits.

Figure 2:
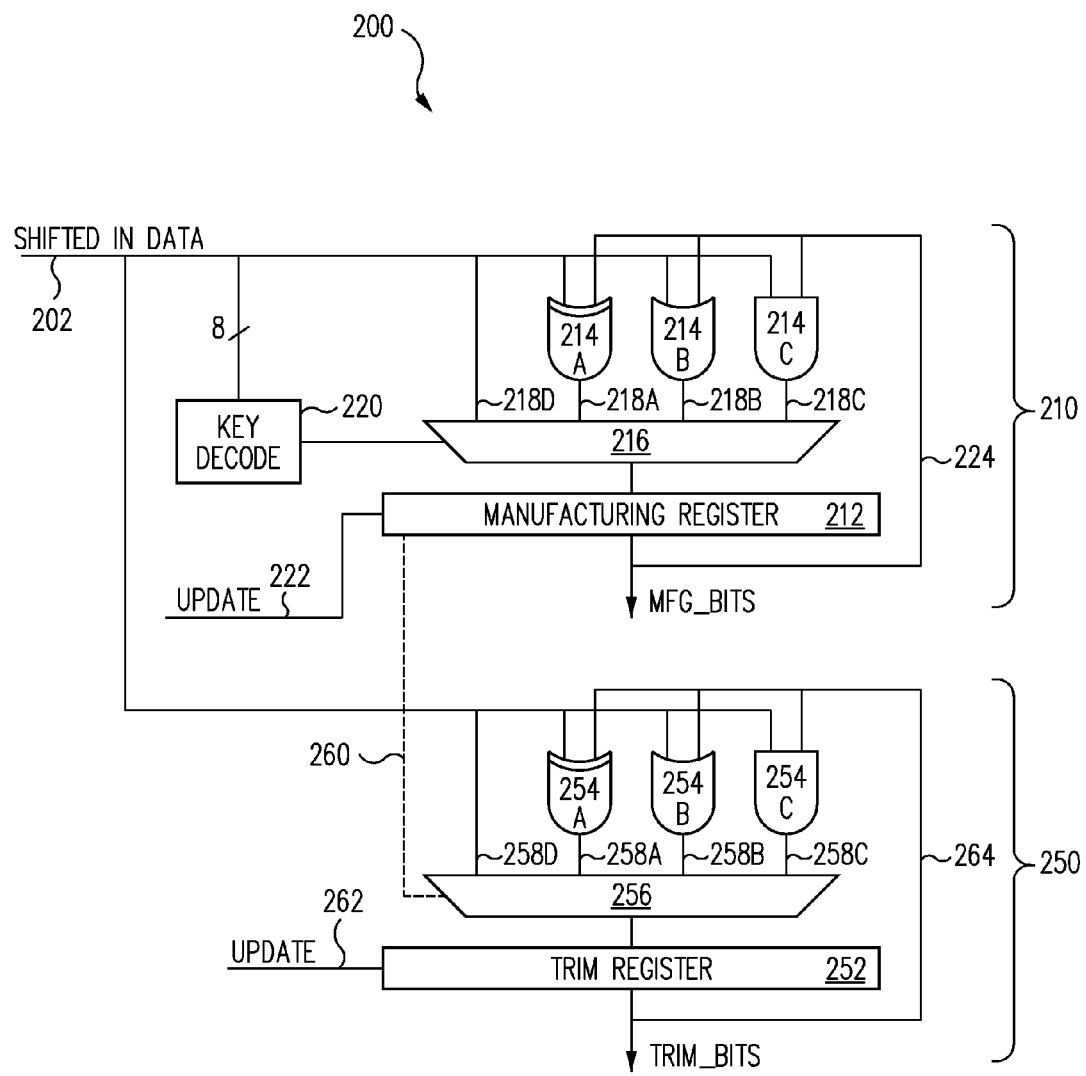
FIG. 2 illustrates a configuration logic circuit in accordance with an embodiment of the invention.

FIG. 2 illustrates a configuration logic circuit 200 in accordance with an embodiment of the invention. In one embodiment, configuration logic circuit 200 may be implemented as part of configuration logic 110 of PLD 100.

Configuration logic circuit 200 includes a data input path 202, a manufacturing data circuit 210, and a trim data circuit 250. In various embodiments, configuration logic circuit 200 may be clocked in any conventional manner by appropriate clocking circuitry (not shown). In one embodiment, data input path 202 may receive data from a JTAG port, such as configuration port 112 of PLD 100. In this regard, such data may be provided by an operator external to PLD 100, such as external system 130 or another appropriate operator. In another embodiment, data input path 202 may receive data from other portions of PLD 100 as may be desired in particular implementations.

In one embodiment, data originally provided in serial form (e.g., through a JTAG port) may be deserialized using conventional circuitry (not shown) and provided to data input path 202 in parallel form. Accordingly, in such an embodiment, data passed by data input path 202, manufacturing data circuit 210, trim data circuit 250, and all other portions of configuration logic circuit 200 may be maintained in parallel form (e.g., through appropriate parallel bus structures). In another embodiment, data may be maintained in serial form throughout configuration logic circuit 200. In yet another embodiment, data may be maintained in serial and parallel forms by different aspects of configuration logic circuit 200.

Manufacturing data circuit 210 includes a register 212, logic circuits 214A-C, a multiplexer 216, input ports 218A-D, a selector circuit 220, an update port 222, and a feedback path 224.

Manufacturing data circuit 210 may receive data over data input path 202. Such data may include, for example: initial bit values passed through input port 218D to be loaded (e.g., stored) into register 212; corrective and non-corrective bit values to be operated on by a selected one of logic circuits 214A-C to provide updated bit values to input ports 218A-C; selection bit values (e.g., a key) to be decoded by selector circuit 220 (e.g., a decoder circuit) to select one of input ports 218A-D; and/or other data. In various embodiments, data may be received in the form of one or more data sets. Other data formats are also contemplated.

Register 212 may receive initial bit values or updated bit values passed through a selected one of input ports 218A-D. Register 212 may store bit values in response to, for example, an update signal received at update port 222 from other portions of configuration logic 110.

Data stored in register 212 may correspond to multiple data fields, with each data field identifying a particular feature of PLD 100 that may be selectively enabled, disabled, and/or otherwise configured. In one embodiment, register 212 may be a 128-bit manufacturing register used to set various features of PLD 100 such as, for example: clock override, one or more state machines, mode of operation (e.g., a debugging mode), and/or other features. Other bit sizes and other uses are also contemplated for register 212.

Bit values stored by register 212 may be passed to logic circuits 214A-C through feedback path 224. In this regard, logic circuits 214A-C may perform logic operations on data received over data input path 202 and bit values passed through feedback path 224 to provide updated bit values. Such logic operations may be performed, for example, on serial or parallel data received over data input path 202 and feedback path 224.

Logic circuits 214A-C may be implemented to perform any desired logic operations. For example, as shown in FIG. 2, logic circuits 214A-C may be implemented to perform XOR, OR, and AND logic operations, respectively. Other logic operations are also contemplated.

The results of logic operations performed by logic circuits 214A-C may be passed to multiplexer 212 through input ports 218A-C. Unprocessed data received over data input path 202 may be passed to multiplexer 212 through input port 218D (e.g., a direct input port to permit all bit values to be set, cleared, or written simultaneously).

Selector circuit 220 may be used to select between input ports 218A-D based on selection bit values received over data input path 202. In one embodiment, eight selection bit values may collectively provide a key that is received with a data set (e.g., serially or in parallel with the data set) over data input path 202. For example, the key may be received in advance of a data set or as part of a data set to select an appropriate input port 218A-D for the data set.

Thus, selector circuit 220 may effectively select which logic operation (or no logic operation) is performed on data provided to register 212 by selecting one of input ports 218A-D. The following Table 1 identifies four example keys that may be used to select different input ports 218A-D in accordance with one embodiment.

TABLE 1

| Key Name | MFG_KEY0 | MFG_KEY1 | MFG_KEY2 | MFG_KEY3 |
|---|---|---|---|---|
| Key Selection Bit Values | 8'b01001101 | 8'b01011101 | 8'b01101101 | 8'b01111101 |
| Logic Operation | Direct Input | AND | OR | XOR |
| Input Port | 218D | 218C | 218B | 218A |

As discussed, an initial data set may be received over data input path 202 that includes initial bit values to be stored in register 212. Another data set received over data input path 202 may include corrective bit values and non-corrective bit values provided by an operator. The corrective bit values may be used to adjust the bit values corresponding to particular data fields in register 212. The non-corrective bit values may be used to leave other data fields of register 212 unchanged without requiring the operator to know the previously stored values of other data fields.

A selected logic circuit 214A-C may perform an associated logic operation on a data set that includes corrective and non-corrective bit values, and on stored initial bit values passed through feedback path 224. The resulting updated bit values may be stored in register 212. Such operations may be further understood with reference to an example identified in the following Table 2.

TABLE 2

|  | Data Field 1 | Data Field 2 | Data Field 3 | Data Field 4 |
|---|---|---|---|---|
| Initial Data Set with Initial Bit Values | 0101 | 1010 | 0000 | 0000 |
| Additional Data Set with Corrective and Non-Corrective Bit Values | 1111 | 0000 | 1111 | 0000 |
| Updated Bit Values: Direct Input (Input Port 218D) | 1111 | 0000 | 1111 | 0000 |
| Updated Bit Values: AND (Input Port 218C) | 0101 | 0000 | 0000 | 0000 |
| Updated Bit Values: OR (Input Port 218B) | 1111 | 1010 | 1111 | 0000 |
| Updated Bit Values: XOR (Input Port 218A) | 1010 | 1010 | 1111 | 0000 |

In Table 2, a set of 16 initial bit values are identified which may be initially received over data input path 202 (e.g., as a data set), passed to register 212 through input port 218D, and stored in register 212. The initial bit values may be passed from register 212 to logic circuits 214A-C over feedback path 224. In this example, the initial bit values include four data fields, each of which may be associated with a particular feature of PLD 100. For example, the value of each data field may be used to set a different feature of PLD 100.

As shown in Table 2, an additional data set is identified which includes corrective and non-corrective bit values. This data set may be received over data input path 202 and provided to logic circuits 214A-C. Logic circuits 214A-C may perform associated logic operations on the initial bit values (e.g., received over feedback path 224) and the corresponding corrective and non-corrective bit values in the additional data set.

As shown in Table 2, depending on the particular input port 218A-D selected by selector circuit 220, different updated bit values may be provided to register 212. For example, if input port 218D is selected, then the bit values of the additional data set may be passed through multiplexer 212 to register 212.

If input port 218C is selected, then updated bit values from logic circuit 218C may be passed through multiplexer 216 to register 212. Logic circuit 218C may perform an AND logic operation on the initial bit values and the additional data set. In this case, 0 bit values in the additional data set operate as corrective bit values, and 1 bit values of the additional data set operate as non-corrective bit values. In this regard, a 0 bit value in the additional data set causes the resulting updated bit value to exhibit a 0 bit value, regardless of the corresponding initial bit value. A 1 bit value in the additional data set causes the resulting updated bit value to keep the initial bit value.

If input port 218B is selected, then updated bit values from logic circuit 218B may be passed through multiplexer 216 to register 212. Logic circuit 218B may perform an OR logic operation on the initial bit values and the corresponding corrective and non-corrective bit values in the additional data set. In this case, 1 bit values in the additional data set operate as corrective bit values, and 0 bit values of the additional data set operate as non-corrective bit values. In this regard, a 1 bit value in the additional data set causes the resulting updated bit value to exhibit a 1 bit value, regardless of the corresponding initial bit value. A 0 bit value in the additional data set causes the resulting updated bit value to keep the initial bit value.

If input port 218A is selected, then updated bit values from logic circuit 218A may be passed through multiplexer 216 to register 212. Logic circuit 218A may perform an XOR logic operation on the initial bit values and the corresponding corrective and non-corrective bit values in the additional data set. In this case, 1 bit values in the additional data set operate as corrective bit values, and 0 bit values of the additional data set operate as non-corrective bit values. In this regard, a 1 bit value in the additional data set causes the resulting updated bit value to switch (e.g., toggle) to the opposite of the corresponding initial bit value. A 0 bit value in the additional data set causes the resulting updated bit value to keep the initial bit value.

Thus, it will be appreciated that 0 or 1 bit values in the additional data set may be either corrective or non-corrective bit values depending on the particular logic operation performed. Although particular AND, OR, and XOR logic operations have been described, any desired logic operation may be used. Also, although particular data set sizes and data field sizes have been described, any desired data set and data field sizes may be used.

Trim data circuit 250 includes a register 252, logic circuits 254A-C, a multiplexer 256, input ports 258A-D, a select path 260, an update port 262, and a feedback path 264. Trim data circuit 250 may receive data over data input path 202 and may process data using various components in a similar manner as described for corresponding components of manufacturing data circuit 210.

Similar to register 212, data stored in register 252 may correspond to multiple data fields, with each data field identifying a particular feature of PLD 100 that may be selectively enabled, disabled, and/or otherwise configured. In one embodiment, register 252 may be a 128-bit trim register used to set various features of PLD 100 such as, for example: flash memory timing, voltage or current adjustments, and/or other features. Other bit sizes and other uses are also contemplated for register 252.

Logic circuits 254A-C, multiplexer 256, input ports 258A-D, and update port 262 may operate in a similar fashion as described with regard to similar components of manufacturing data circuit 210. Accordingly, it will be appreciated that initial bit values and updated bit values may be processed by the various components of trim data circuit 250 in the manner described with regard to manufacturing data circuit 210. In one embodiment, different update signals may be provided to update ports 222 and 262 to execute parallel loading of bit values into registers 212 and 262 (e.g., registers 212 and 262 may be independently loaded at different times or the same time as may be desired in response to the update signals). In another embodiment, bit values may be serially loaded (e.g., serially shifted) into registers 212 and 262 with or without such update signals.

As shown in FIG. 2, trim data circuit 250 includes select path 260 which may be used by trim data circuit 250 to select input ports 258A-D (e.g., instead of using a selector circuit in the manner of selector circuit 220 of manufacturing data circuit 210). In such an embodiment, register 212 may provide selection bit values to multiplexer 256 over select path 260. In this regard, selection bit values for multiplexer 256 may be included in the bit values stored in register 212. Thus, register 212 and select path 260 may effectively provide a selector circuit for trim data circuit 250. Such an embodiment may reduce design and manufacturing costs by repurposing particular bit values of register 212 as selection bit values. In another embodiment, trim data circuit 250 may include a separate selector circuit in the manner of selector circuit 220.

Figure 3:
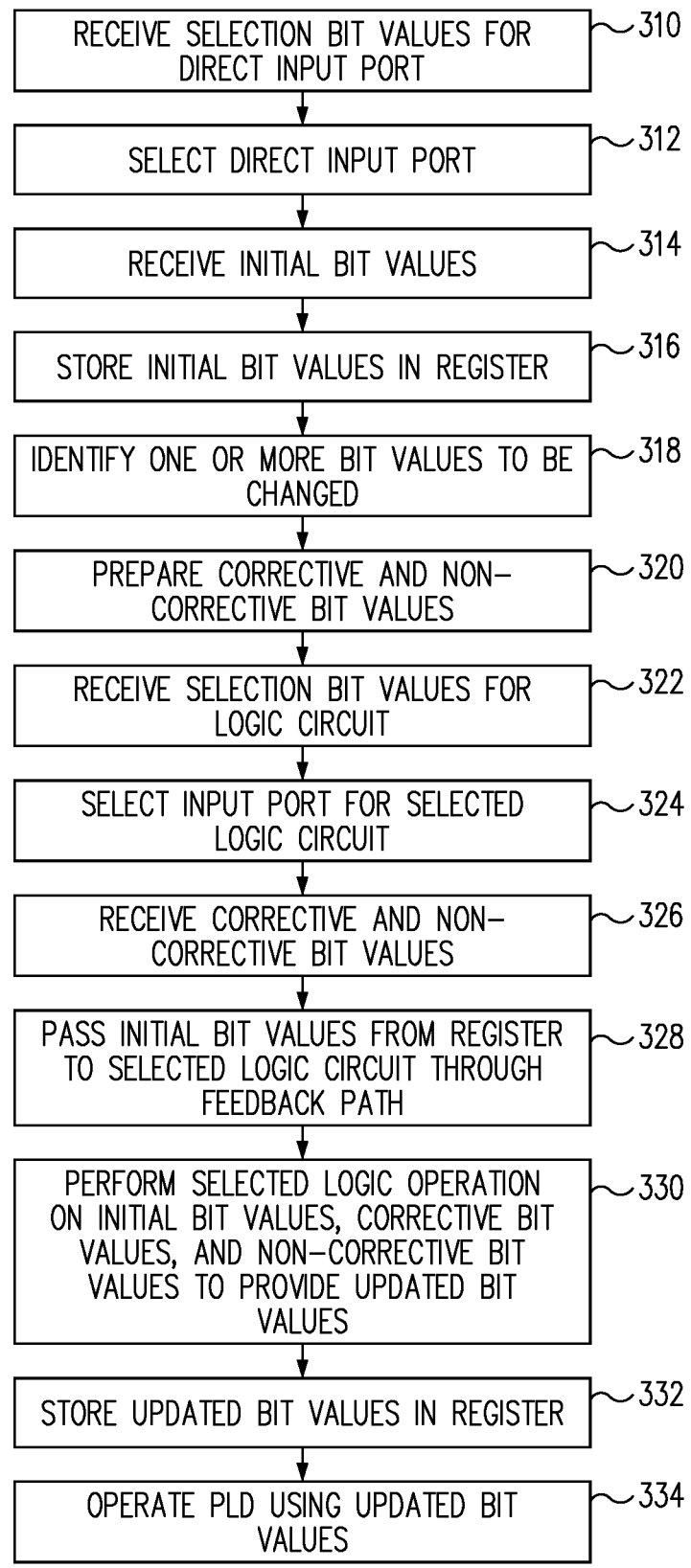
FIG. 3 illustrates a process of programming a register of a configuration logic circuit in accordance with an embodiment of the invention.

FIG. 3 illustrates a process of programming a register of configuration logic circuit 200 in accordance with an embodiment of the invention. Although FIG. 3 will be primarily described with reference to register 212 of manufacturing data circuit 210, the principles described herein may be similarly applied to register 252 of trim data circuit 250.

In block 310, manufacturing data circuit 210 receives selection bit values over data input path 202. Such selection bit values may be received, for example, by selector circuit 220. In one embodiment, the selection bit values may be provided by external system 130. In one embodiment, the selection bit values may correspond to MFG_KEY0 bit values identified in Table 1 which may be used to select input port 218D. In block 312, selector circuit 220 decodes the received selection bit values and selects input port 218D in response thereto.

In block 314, manufacturing data circuit 210 receives initial bit values to be loaded into register 212. In one embodiment, the initial bit values may be provided by external system 130. In one embodiment, the initial bit values may be provided as a data set. In such an embodiment, the previously received selection bit values may be part of the data set (e.g., the selection bit values may be appended to the beginning of the data set). Because input port 218D was previously selected in block 312, multiplexer 212 may pass the initial bit values to register 212.

In block 316, register 212 stores the initial bit values, for example, in response to an update signal received at update port 222 from other portions of configuration logic 110 (e.g., in the case of parallel loading), or without an update signal (e.g., in the case of serial loading).

In block 318, one or more of the initial bit values to be changed are identified. For example, the bit values to be changed may correspond to one or more data fields stored in register 212 that an operator desires to change in order to adjust the operation of PLD 100. In one embodiment, the bit values to be changed may be identified by a human operator of external system 130. In another embodiment, the bit values to be changed may be identified by a machine implemented process running on external system 130.

In block 320, corrective and non-corrective bit values are prepared. As discussed, an operator (e.g., external system 130 or a human operator) may set the corrective bit values to update particular data fields of register 212, and may set the non-corrective bit values to leave other data fields of register 212 unchanged. As discussed, the operator may set corrective bit values for any bit values that are to be changed, while providing default values for the non-corrective bit values. Accordingly, the operator is not required to know the previously stored initial bit values for bits that remain unchanged.

In block 322, manufacturing data circuit 210 receives selection bit values over data input path 202. Similar to block 310, such selection bit values may be received, for example, by selector circuit 220 and may be provided by external system 130.

In one embodiment, the selection bit values received in block 322 may correspond to MFG_KEY1, MFG_KEY2, or MFG_KEY3 identified in Table 1 which may be used to select input port 218C, 218B, or 218A, respectively.

In block 324, selector circuit 220 decodes the received selection bit values and selects one of input ports 218A-C in response thereto.

In block 326, manufacturing data circuit 210 receives the corrective and non-corrective bit values. In one embodiment, the corrective and non-corrective bit values may be provided as a data set. In such an embodiment, the selection bit values received in block 322 may be part of the data set (e.g., the selection bit values may be appended to the beginning of the data set).

In block 328, register 212 passes the initial bit values that were previously stored in block 316 to logic circuits 214A-C through feedback path 224.

In block 330, logic circuits 214A-C perform their associated logic operations on the initial bit values received through feedback path 224, and on the corrective and non-corrective bit values received through data input path 202. The updated bit values resulting from the logic operations may be provided to input ports 218A-C. Also in block 330, multiplexer 216 passes the updated bit values received at the selected one of input ports 218A-C (e.g., selected in block 324) to register 212.

In block 332, register 212 stores the updated bit values, for example, in response to an update signal received at update port 222 from other portions of configuration logic 110 (e.g., in the case of parallel loading), or without an update signal (e.g., in the case of serial loading).

In block 334, PLD 100 may be operated in accordance with the updated bit values stored in register 212.

The process of FIG. 3 may be modified in accordance with various embodiments. For example, in one embodiment, one or more data fields of register 212 may be further updated by repeating blocks 318 through 332. In this regard, any desired number of data sets or other data structures may be provided to configuration logic circuit 200 in an iterative fashion (e.g., using the same or different logic operations, and the same or different corrective and non-corrective bit values) until the data fields of register 212 are set as desired.

The process of FIG. 3 may also be applied to corresponding components of trim data circuit 250. In this regard, the various blocks of FIG. 3 may be modified to accommodate differences between manufacturing data circuit 210 and trim data circuit 250. For example, blocks 310/312 and 322/324 may be modified such that trim data circuit 260 receives selection bit values from manufacturing register 212 over selection path 260. In another embodiment, trim data circuit 250 may include a separate selector circuit in the manner of selector circuit 220 to permit the process of FIG. 3 to be performed for trim data circuit 250 in substantially the same manner as for manufacturing data circuit 210.

Embodiments described above illustrate but do not limit the invention. It should also be understood that numerous modifications and variations are possible in accordance with the principles of the present invention. Accordingly, the scope of the invention is defined only by the following claims.

We claim:

1. A method of updating a control register within an integrated circuit, the method comprising:
   storing a plurality of initial bit values in the control register within the integrated circuit;
   receiving a data set comprising one or more corrective bit values and one or more non-corrective bit values;
   selecting a logic operation;
   performing the selected logic operation on the received data set and the initial bit values to provide updated bit values; and
   replacing the initial bit values with the updated bit values in the control register.

2. The method of claim 1, wherein the selecting is performed by:
   receiving selection bit values with the data set; and
   selecting the logic operation using the received selection bit values.

3. The method of claim 1, wherein the control register is a first control register, wherein the selecting is performed by:
   receiving selection bit values from a second control register within the integrated circuit; and
   selecting the logic operation using the received selection bit values.

4. The method of claim 1, wherein the data set is a first data set, the corrective bit values are first corrective bit values, the non-corrective bit values are first non-corrective bit values, the logic operation is a first logic operation, and the updated bit values are first updated bit values, the method further comprising:
   selecting a second logic operation used to provide second updated bit values;
   receiving a second data set comprising one or more second corrective bit values and one or more second non-corrective bit values;
   performing the second logic operation on the received second data set and the first updated bit values to provide the second updated bit values; and
   replacing the first updated bit values with the second updated bit values in the control register.

5. The method of claim 1, wherein the control register is a first control register, the initial bit values are first initial bit values, the data set is a first data set, the corrective bit values are first corrective bit values, the non-corrective bit values are first non-corrective bit values, the logic operation is a first logic operation, and the updated bit values are first updated bit values, the method further comprising:
   storing a plurality of second initial bit values in a second control register within the integrated circuit;
   receiving a second data set comprising one or more second corrective bit values and one or more second non-corrective bit values;
   performing a second logic operation on the second received data set and the second initial bit values to provide second updated bit values; and
   replacing the second initial bit values with the second updated bit values in the second control register.

6. The method of claim 5, further comprising:
   receiving first selection bit values from the second control register;
   using the received first selection bit values to select the first logic operation used to provide the first updated bit values;
   receiving second selection bit values with the second data set; and
   using the received second selection bit values to select the second logic operation used to provide the second updated bit values.

7. The method of claim 1, wherein the data set is parallel data received over a multi-bit bus.

8. The method of claim 1, wherein the data set is a serial bitstream.

9. The method of claim 1, wherein the updated bit values are configured to set operating parameters of a programmable logic device (PLD).

10. An integrated circuit comprising:
    a control register adapted to store a plurality of initial bit values for controlling operation of the integrated circuit;
    a plurality of logic circuits each adapted to perform an associated logic operation on a received data set and the initial bit values to provide updated bit values to the control register to replace the initial bit values;
    a feedback path adapted to pass the initial bit values from the control register to the logic circuits;

a multiplexer comprising a plurality of inputs adapted to receive the updated bit values from each of the logic circuits; and a selector circuit adapted to select one of the inputs to pass the updated bit values through the selected one of the inputs to the control register.

11. The integrated circuit of claim 10, wherein the selector circuit comprises a decoder circuit adapted to receive selection bit values with the data set and select the one of the inputs using the received selection bit values.

12. The integrated circuit of claim 10, wherein the control register is a first control register, wherein the selector circuit comprises a second control register adapted to store selection bit values and a circuit path adapted to provide the selection bit values to the multiplexer to select the one of the inputs.

13. The integrated circuit of claim 10, wherein the data set is a first data set, the updated bit values are first updated bit values, and the selected one of the inputs is a first one of the inputs;

wherein the logic circuits are each adapted to perform their associated logic operation on a second received data set and the first updated bit values to provide second updated bit values to the control register; and wherein the selector circuit is adapted to select a second one of the inputs to pass the second updated bit values through the selected second one of the inputs to the control register to replace the first updated bit values.

14. The integrated circuit of claim 10, wherein the control register is a first control register, the initial bit values are first initial bit values, the logic circuit is a first logic circuit, the logic operation is a first logic operation, the data set is a first data set, the updated bit values are first updated bit values, and the feedback path is a first feedback path, the integrated circuit further comprising:

a second control register adapted to store a plurality of second initial bit values for controlling operation of the integrated circuit; and a second logic circuit in communication with the second control register and adapted to selectively perform a second logic operation on a second received data set and the second initial bit values to provide second updated bit values to the second control register to replace the second initial bit values.

15. The integrated circuit of claim 14, wherein the first logic circuit is one of a plurality of first logic circuits each adapted to perform an associated first logic operation on the first received data set and the first initial bit values, and wherein the second logic circuit is one of a plurality of second logic circuits each adapted to perform an associated second logic operation on the second received data set and the second initial bit values, the integrated circuit further comprising:

a first multiplexer comprising a plurality of first inputs adapted to receive the first updated bit values from each of the first logic circuits;

a first selector circuit adapted to select one of the first inputs to pass the first updated bit values through the selected one of the first inputs to the first control register, wherein the first selector circuit comprises:

the second control register adapted to store first selection bit values, and a circuit path adapted to provide the first selection bit values to the first multiplexer to select the one of the first inputs;

a second multiplexer comprising a plurality of second inputs adapted to receive the second updated bit values from each of the second logic circuits; and a second selector circuit adapted to select one of the second inputs to pass the second updated bit values through the selected one of the second inputs to the second control register, wherein the second selector circuit comprises a decoder circuit adapted to receive second selection bit values with the second data set and decode the received second selection bit values to select the second one of the inputs.

16. The integrated circuit of claim 10, wherein the data set is parallel data received over a multi-bit bus.

17. The integrated circuit of claim 10, wherein the data set is a serial bitstream.

18. The integrated circuit of claim 10, wherein the integrated circuit is part of a programmable logic device (PLD) and the updated bit values are configured to set operating parameters of the PLD.

19. An integrated circuit comprising:

a control register adapted to store a plurality of bit values;

a multiplexer coupled to inputs of the control register;

a plurality of logic circuits coupled to inputs of the multiplexer, each logic circuit adapted to perform an associated logic operation on a received data set and bit values stored in the control register and provide updated bit values resulting from the operation;

a feedback path adapted to pass bit values stored in the control register from the control register to inputs of the logic circuits; and a selector circuit adapted to select a multiplexer input and its coupled logic circuit to pass the updated bit values from the coupled logic circuit to the control register.

20. The integrated circuit of claim 19, wherein the data set is parallel data received over a multi-bit bus.

21. The integrated circuit of claim 19, wherein the data set is a serial bitstream.

22. The integrated circuit of claim 19, wherein the integrated circuit is part of a programmable logic device (PLD) and the updated bit values are configured to set operating parameters of the PLD.

23. The integrated circuit of claim 19, wherein the selector circuit comprises a decoder circuit adapted to receive selection bit values with the received data set.

24. The integrated circuit of claim 19, wherein the selector circuit comprises a second control register adapted to store selection bit values.

* * * * *